(12) United States Patent
Abdel-Hafeez et al.

(10) Patent No.: US 6,356,509 B1
(45) Date of Patent: Mar. 12, 2002

(54) SYSTEM AND METHOD FOR EFFICIENTLY IMPLEMENTING A DOUBLE DATA RATE MEMORY ARCHITECTURE

(75) Inventors: Saleh M. Abdel-Hafeez, Santa Clara; Sarathy P. Sribhashyam, San Jose, both of CA (US)

(73) Assignee: Sonicblue, Incorporated, Santa Clara, CA (US)

( * ) Notice: Subject to any disclaimer, the term of this patent is extended or adjusted under 35 U.S.C. 154(b) by 0 days.

(21) Appl. No.: 09/729,869

(22) Filed: Dec. 5, 2000

(51) Int. Cl.[7] .............................. G11C 8/00
(52) U.S. Cl. ..................................... 365/233
(58) Field of Search ................. 365/233, 230.03, 365/230.04, 189.04

(56) References Cited

U.S. PATENT DOCUMENTS 6,094,375 A * 7/2000 Lee ..................... 365/189.04
6,198,688 B1 * 3/2001 Choi ..................... 265/233
6,282,131 B1 * 8/2001 Roy ..................... 365/191
6,282,150 B1 * 8/2001 Edo ..................... 365/233

\* cited by examiner

Primary Examiner—Richard Elms
Assistant Examiner—Anh Phung
(74) Attorney, Agent, or Firm—Fenwick & West LLP

(57) ABSTRACT

A system and method for efficiently implementing a double data rate memory architecture comprises a memory device that includes a memory core with low-footprint memory cells that are configured into even cell rows and odd cell rows. The memory device sequentially performs data transfer operations using the even cell rows and the odd cells rows. The sequential data transfer operations using the even cell rows may be synchronized to a first edge of a periodic clock pulse from a memory clock, and the sequential data transfer operations using the odd cell rows may be synchronized to a second edge of the periodic clock pulse from the memory clock to thereby implement the double data rate memory architecture.

62 Claims, 11 Drawing Sheets

SYSTEM AND METHOD FOR EFFICIENTLY IMPLEMENTING A DOUBLE DATA RATE MEMORY ARCHITECTURE

BACKGROUND SECTION

1. Field of the Invention

This invention relates generally to electronic memory systems, and relates more particularly to a local system and method for efficiently implementing a double data rate memory architecture.

2. Description of the Background Art

Implementing efficient methods for managing data is a significant consideration for designers and manufacturers of contemporary electronic devices. However, managing data storage and retrieval operations in an electronic device may create substantial challenges for designers of electronic networks. For example, enhanced demands for increased device functionality, bandwidth, and performance during data transfer operations may require more system processing power and require additional hardware resources. An increase in processing or hardware requirements may also result in a corresponding detrimental economic impact due to increased production costs and operational inefficiencies.

Furthermore, enhanced device capability to perform various advanced data handling operations may provide additional benefits to a system user, but may also place increased demands on the control and management of the various components in the electronic device. For example, an enhanced electronic device that effectively accesses, processes, and displays digital video data may benefit from efficient data storage and retrieval techniques because of the large amount and complexity of the digital data involved.

Memory speed is a significant feature in most electronic devices, and is thus an important consideration for both device users and device manufacturers. An electronic device with a higher memory speed is generally able to handle data transfer operations and processes more rapidly than an electronic device having a lower memory speed, so modern electronic devices are typically designed with maximum memory speed and throughput as an important engineering goal.

Memory speeds are significantly affected by the clock frequency of a particular electronic device, with higher clock frequencies usually resulting in higher memory speeds. In general, a clock signal is distributed to various memory circuits within a computer system to control timing of the device's memory components, to thereby synchronize the data transfer processes. Typically, the clock signal consists of a series of pulses having a specified frequency and specified voltage levels. Each clock pulse includes a rising edge and a falling edge, however, conventional electronic devices, and design synthesis tools typically utilize only a single edge of the clock pulse to synchronize the data transfer operations.

Due to growing demands on system resources and substantially increasing data magnitudes, it is apparent that developing new and effective memory architectures is a matter of importance for the related electronic technologies. Therefore, for all the foregoing reasons, implementing efficient methods for managing data remains a significant consideration for designers, manufacturers, and users of contemporary electronic devices.

SUMMARY

In accordance with the present invention, a system and method are disclosed for efficiently implementing a double data rate memory architecture. In one embodiment, a memory device may preferably be implemented to include a decoder, an input/output circuit, and a memory core. The memory core may preferably include a matrix of low-footprint memory cells that are configured in alternating even cell rows and odd cell rows. The memory cells are designed with precharge sensing mechanisms in order to utilize the speed and area of the memory core.

In practice, initially, the decoder may preferably receive a memory address from an address source for accessing one or more horizontal cell rows in the memory core to perform a read operation or a write operation. In response, the memory device preferably may determine a current clock edge state of a memory clock. In accordance with the present invention, the memory clock preferably may comprise a periodic clock pulse that includes a falling edge and a rising edge.

If the current clock edge state is synchronized with a falling edge of the memory clock and the memory device is performing a read operation, then precharge mechanisms preferably begin precharging memory cells in the odd cell rows of the memory core. In either a read operation or a write operation, if the current clock edge state is synchronized with a falling edge of the memory clock, then the decoder preferably determines whether an even memory address has been received from the foregoing address source. If an even memory address has not been received from the address source, then the memory device preferably aborts the data transfer operation.

However, if an even memory address has been received from the address source, then the decoder preferably may activate an appropriate even write word line or even read word line that corresponds to the received even memory address, to thereby select an appropriate even cell row in the memory core. In a read operation, a multiplexor in the input/output circuit preferably may select an appropriate even read bit line or even write bit line for accessing the selected horizontal cell row of the memory core.

In a write operation, the input/output circuit may access the selected horizontal cell row of the memory core by an appropriate even read bit line or even write bit line based upon the clock edge, and may temporarily buffer the transfer data using a local buffer mechanism in the input/output circuit. Finally, the input/output circuit preferably may either perform a write operation to provide transfer data from a data source to the selected horizontal cell row, or may alternately perform a read operation to provide the transfer data from the selected horizontal cell row to a data destination.

In contrast to the foregoing process (which preferably occurs at a falling edge of the memory clock), if the current clock edge state is synchronized with a rising edge of the memory clock and the memory device is performing a read operation, then precharge mechanisms preferably begin precharging memory cells in the even cell rows of the memory core. In either a read operation or a write operation, if the current clock edge state is synchronized with a rising edge of the memory clock, then the decoder preferably determines whether an odd memory address has been received from the foregoing address source. If an odd memory address has not been received from the address source, then the memory device preferably is not selected and no data is read or written to the memory cells.

However, if an odd memory address has been received from the address source, then the decoder preferably may activate an appropriate odd write word line or odd read word line that corresponds to the received even memory address, to thereby select an appropriate odd cell row of the memory core. In a read operation, a multiplexor in the input/output circuit preferably may select an appropriate odd read bit line or odd write bit line for accessing the selected horizontal cell row of the memory core.

In a write operation, the input/output circuit may access the selected horizontal cell row of the memory core by an appropriate odd read bit line or odd write bit line, and temporarily buffer the transfer data using a local buffer mechanism in the input/output circuit. Finally, the input/output circuit preferably may either perform a write operation to provide the transfer data from a data source to the selected horizontal cell row, or may alternately perform a read operation to provide the transfer data from the selected horizontal cell row to a data destination.

The foregoing procedure may then be repeated to alternately perform further data transfer operations to appropriate even horizontal rows or odd horizontal rows of the memory core, in accordance with the present invention. In addition, in certain embodiments, the foregoing procedure may readily be implemented so that the memory device accesses even cell rows on a rising edge of the memory clock, and conversely accesses odd cell rows on a falling edge of the memory clock. The present invention therefore provides a local system and method for more efficiently and effectively implementing a double data rate memory architecture.

DETAILED DESCRIPTION

The present invention relates to an improvement in memory architectures for electronic devices. The following description is presented to enable one of ordinary skill in the art to make and use the invention and is provided in the context of a patent application and its requirements. Various modifications to the preferred embodiment will be readily apparent to those skilled in the art, and the generic principles herein may be applied to other embodiments. Thus, the present invention is not intended to be limited to the embodiment shown, but is to be accorded the widest scope consistent with the principles and features described herein.

The present invention comprises a system and method for efficiently implementing a double data rate memory architecture, and includes a memory device with a memory core has low-footprint memory cells which are configured into even cell rows and odd cell rows. The memory device may sequentially perform data transfer operations using the even cell rows and the odd cells rows. The sequential data transfer operations using the even cell rows are preferably synchronized to a first edge of a periodic clock pulse from a memory clock, and the sequential data transfer operations using the odd cell rows are preferably synchronized to a second edge of the periodic clock pulse from the memory clock to thereby effectively implement the double data rate memory architecture.

Figure 1:
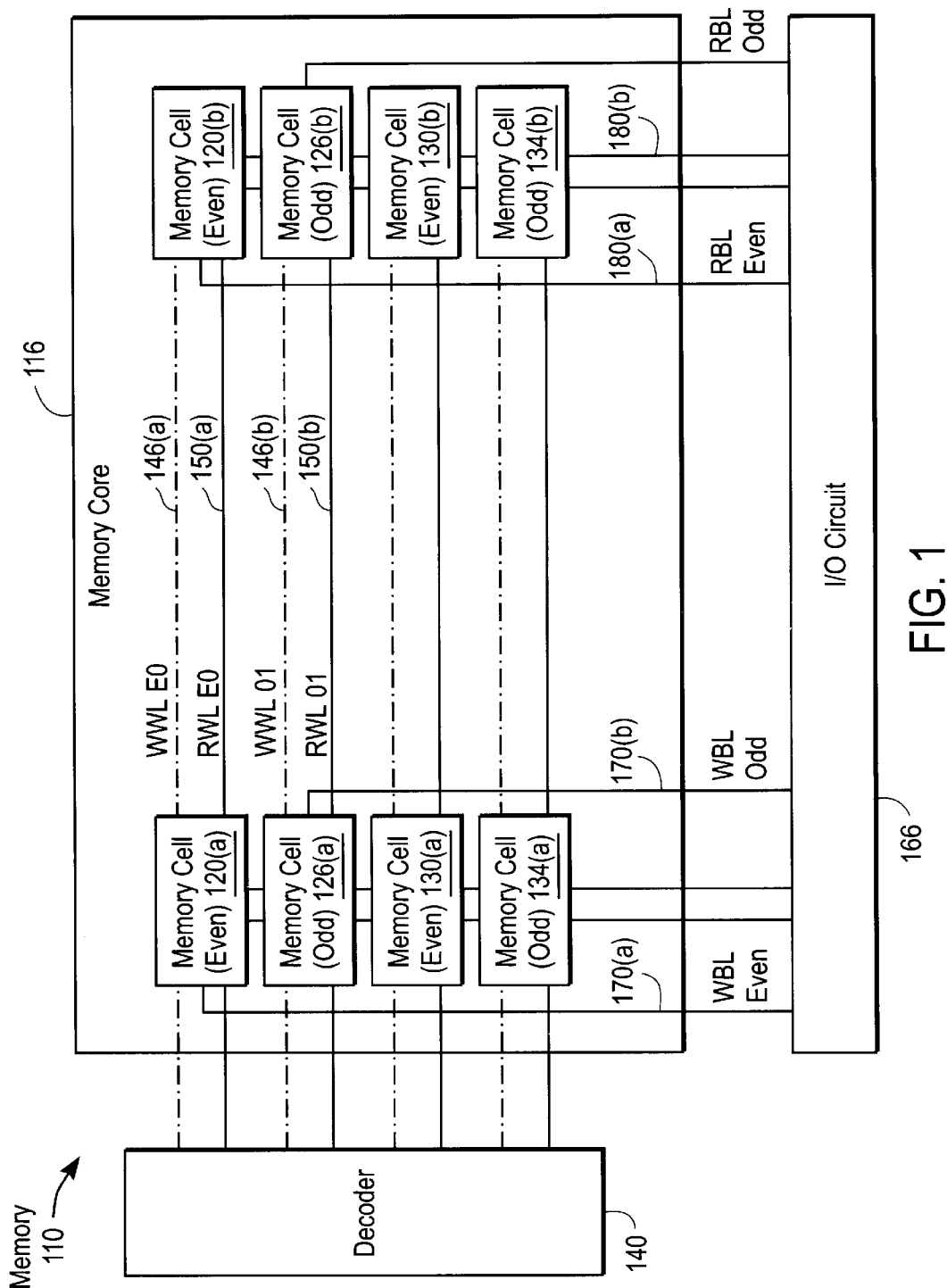
FIG. 1 is a block diagram for one embodiment of a memory device, in accordance with the present invention.

Referring now to FIG. 1, a block diagram for one embodiment of a memory 110 is shown, in accordance with the present invention. In the FIG. 1 embodiment, memory 110 preferably includes, but is not limited to, a memory core 116, a decoder 140, and an input/output (I/O) circuit 166. In alternate embodiments, memory 110 may readily be implemented to include various other architectures and components in addition to, or instead of, those architectures and components discussed in conjunction with the FIG. 1 embodiment.

In the FIG. 1 embodiment, memory core 116 preferably may include an array of memory cells that are arranged in a series of horizontal rows and vertical columns. For example, in FIG. 1, an even horizontal row zero (E0) may include memory cell 120(*a*) and memory cell 120(*b*). Similarly, an odd horizontal row one (O1) may include memory cell 126(*a*) and memory cell 126(*b*). In addition, an even horizontal row two (E2) may include memory cell 130(*a*) and memory cell 130(*b*). Finally, an odd horizontal row one (O3) may include memory cell 134(*a*) and memory cell 134(*b*). In the FIG. 1 embodiment, a vertical column A may preferably include memory cells 120(*a*), 126(*a*), 130(*a*), and 134(*a*). Furthermore, a vertical column B may preferably include memory cells 120(*b*), 126(*b*), 130(*b*), and 134(*b*).

In the FIG. 1 embodiment, for purposes of clarity, memory core 116 is shown with only four horizontal rows and two vertical columns of memory cells. However, in actual practice, memory core typically comprises a significantly larger number of both horizontal rows and vertical columns. In order to clearly describe the operation of the present invention, the functionality of even horizontal row zero (E0) and odd horizontal row one (O1) will primarily be discussed herein. However, similar principles from the present invention may be utilized for the operation of any desired memory cells in memory core 116.

In normal operation of the FIG. 1 embodiment, data may preferably be written into or read out of a selected horizontal row in memory core 116 through I/O circuit 166 after decoder 140 has enabled the selected horizontal row in response to a memory address that preferably may be received from an external source such as a host processor device. In the FIG. 1 embodiment, decoder preferably enables a selected row with a corresponding write word line or read word line, depending upon the type of data transfer operation.

For example, in the FIG. 1 embodiment, decoder 140 preferably may enable a write operation in even horizontal row zero (E0) by activating a write word line E0 (WWL E0) (146(*a*)) that communicates with memory cell 120(*a*) and memory cell 120(*b*). Similarly, decoder 140 may preferably enable a read operation in even horizontal row zero (E0) by activating a read word line E0 (RWL E0) (150(*a*)) that communicates with memory cell 120(*a*) and memory cell 120(*b*).

In addition, decoder 140 preferably may enable a write operation in odd horizontal row 1 (O1) by activating a write word line O1 (WWL O1) (146(*b*)) that communicates with memory cell 126(*a*) and memory cell 126(*b*). Similarly, decoder 140 may preferably enable a read operation in odd horizontal row 1 (O1) by activating a read word line O1 (RWL 01) (150(*b*)) that communicates with memory cell 126(*a*) and memory cell 126(*b*).

For example, in the FIG. 1 embodiment, I/O circuit 166 may preferably transfer data into and out of memory core 116 through a series of read bit lines and write bit lines that communicate with appropriate memory cells in memory core 116. I/O circuit 166 preferably may thus provide transfer data to a data transfer destination during a read operation, or may receive transfer data from a data transfer source during a write operation.

In the FIG. 1 embodiment, I/O circuit 166 preferably may write data to either even horizontal row zero (E0) or even horizontal row two (E2) via even write bit line (WBL Even) 170(*a*). Similarly, I/O circuit 166 preferably may write data to either odd horizontal row one (O1) or odd horizontal row three (O3) via odd write bit line (WBL Odd) 170(*b*). In addition, I/O circuit 166 preferably may read data from either even horizontal row zero (E0) or even horizontal row two (E2) via even read bit line (RBL Even) 180(*a*). Finally, I/O circuit 166 preferably may read data from either odd horizontal row one (O1) or odd horizontal row three (O3) via odd read bit line (RBL Odd) 170(*b*).

For purposes of clarity, FIG. 1 shows the memory cells in vertical column A (memory cells 120(*a*), 126(*a*), 130(*a*), and 134(*a*)) as being connected only to either WBL Even 170(*a*) or WBL Odd 170(*b*). In practice, the memory cells in vertical column A are also connected to either a corresponding even read bit line or a corresponding odd read bit line. For example, I/O circuit 166 preferably may read data from either memory cell 120(*a*) or memory cell 130(*a*) via a corresponding even read bit line (not shown) using a configuration similar to that shown in vertical column B for memory cells 120(*b*) and 130(*b*). I/O circuit 166 preferably may also read data from either memory cell 126(*a*) or memory cell (134(*a*) via a corresponding odd read bit line (not shown) using a configuration similar to that shown in vertical column B for memory cells 126(*b*) and 134(*b*).

For purposes of clarity, FIG. 1 also shows the memory cells in vertical column B (memory cells 120(*b*), 126(*b*), 130(*b*), and 134(*b*)) as being connected only to either RBL Even 180(*a*) or RBL Odd 180(*b*). In practice, the memory cells in vertical column B are also connected to either a corresponding even write bit line or a corresponding odd write bit line. For example, I/O circuit 166 preferably may write data to either memory cell 120(*b*) or memory cell 130(*b*) via a corresponding even write bit line (not shown) using a configuration similar to that shown in vertical column A for memory cells 120(*a*) and 130(*a*). I/O circuit 166 preferably may also write data to either memory cell 126(*b*) or memory cell 134(*b*) via a corresponding odd write bit line (not shown) using a configuration similar to that shown in vertical column A for memory cells 126(*a*) and 134(*a*).

In alternate embodiments, the memory cells in memory core 116 may be configured in various manners other than that shown in the FIG. 1 embodiment. For example, all even memory cells may be configured in a first contiguous section of memory core 116, and all odd memory cells may be configured in a second contiguous section of memory core 116. In addition, he memory cells in memory core 116 may be divided into various groupings other than the odd memory cells and even memory cells shown in FIG. 1. For example, the odd memory cells and even memory cells of the present invention may alternately be configured as sequential vertical rows within memory core 116.

In the FIG. 1 embodiment, memory 110 may be implemented as part of any appropriate electronic system. For example, memory 110 may be implemented as synchronous dynamic random-access memory (SDRAM) that is utilized as local memory in an integrated circuit device, such as an application specific integrated circuit (ASIC) or a microprocessor device.

In the FIG. 1 embodiment, I/O circuit 166 may include various circuitry to facilitate the selection of an appropriate read bit line or write bit line, and the transfer of data to or from memory 110. For example, I/O circuit 166 may include various buffer mechanisms for temporarily buffering the transfer data in a write operation before sending the transfer data to appropriate memory cells in memory core 110. I/O circuit 166 may also include multiplexor devices for selecting and providing transfer data from memory core 116 to an appropriate data destination during a read operation. The foregoing multiplexor devices are further discussed below in conjunction with FIG. 5.

Figure 2:
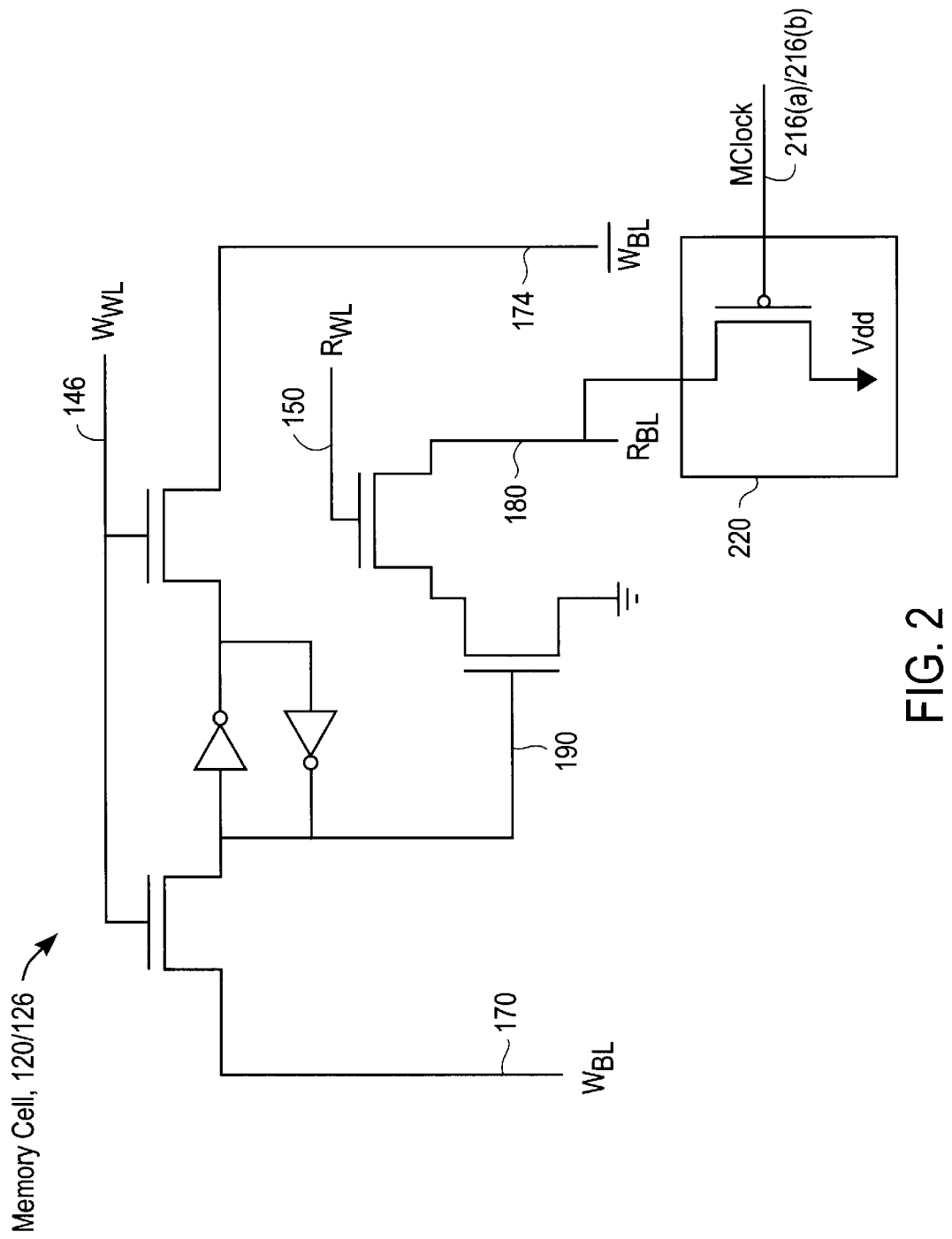
FIG. 2 is a schematic diagram for one embodiment of a memory cell of FIG. 1, in accordance with the present invention.

Referring now to FIG. 2, a schematic diagram for one embodiment of a FIG. 1 memory cell 120, 126 is shown, in accordance with the present invention. In alternate embodiments, memory cell 120, 126 may readily be implemented to include various other configurations and components in addition to, or instead of, those configurations and components discussed in conjunction with the FIG. 2 embodiment.

In addition, as discussed above, for reasons of clarity, the present invention is discussed in the context of the memory cells 120, 126 from even horizontal row E0 and odd horizontal row O1 of FIG. 1. However, similar principles from the invention may be utilized for the operation of any memory cells from memory core 116.

In the FIG. 2 embodiment, memory cell 120, 126 may preferably be implemented as a low-footprint memory cell that stores a single bit of digital information by utilizing a simple architecture that is advantageously configured to occupy a relatively small amount of physical space in memory core 116. In the FIG. 2 embodiment, memory cell 120, 126 preferably includes two N-channel metal oxide semiconductor (NMOS) devices and two inverters in a write portion of corresponding memory cell 120, 126 which is connected to write word line (WWL) 146, write bit line (WBL) 170 and inverted write bit line (inverted WBL) 174.

Memory cell 120, 126 also preferably includes two N-channel metal oxide (NMOS) semiconductor devices in a read portion of the corresponding memory cell 120, 126 which is connected to a read word line (RWL) 150 and a read bit line (RBL) 180. Memory cell 120, 126 preferably may thereby receive and store a bit of digital data at storage location 190 of memory cell 120, 126. In addition, memory cell 120, 126 is also connected to a precharge mechanism 220 that is discussed below in further detail.

During a typical write operation, decoder 140 may enable memory cell 120, 126 for a write operation by asserting write word line (WWL) 146. As discussed above in conjunction with FIG. 1, WWL 146 may preferably include an even write word line 146(a) in cases where a memory cell is an even memory cell 120(a), 120(b) from an even horizontal row. WWL 146 may also preferably include an odd write word line 146(b) in cases where a memory cell is an odd memory cell 126(a), 126(b) from an odd horizontal row.

I/O circuit 166 may responsively provide transfer data to memory cell 120, 126 during a write operation via one or more write bit lines (WBL) 170, 174. In the FIG. 2 embodiment, an inverted write bit line (inverted WBL) 174 may selectively be utilized by I/O circuit 166 to provide an inverted complement of the transfer data during a particular write operation. As discussed above in conjunction with FIG. 1, WBL 170 (or inverted WBL 174) may preferably include an even write bit line 170(a) in cases where a memory cell is an even memory cell 120(a), 120(b) from an even horizontal row. WBL 170 (or inverted WBL 174) may also preferably include an odd write bit line 170(b) in cases where a memory cell is an odd memory cell 126(a), 126(b) from an odd horizontal row.

During a read operation, decoder 140 may enable memory cell 120, 126 for a read operation via read word line (RWL) 150. As discussed above in conjunction with FIG. 1, RWL 150 may preferably include an even read word line 150(a) in cases where a memory cell is an even memory cell 120(a), 120(b) from an even horizontal row. RWL 150 may also preferably include an odd read word line 150(b) in cases where a memory cell is an odd memory cell 126(a), 126(b) from an odd horizontal row.

I/O circuit 166 may responsively access transfer data from memory cell 120, 126 during a read operation via read bit line (RBL) 180. As discussed above in conjunction with FIG. 1, RBL 180 may preferably include an even read bit line 180(a) in cases where a memory cell is an even memory cell 120(a), 120(b) from an even horizontal row. RBL 180 may also preferably include an odd read bit line 180(b) in cases where a memory cell is an odd memory cell 126(a), 126(b) from an odd horizontal row.

In accordance with the present invention, RBL 180 may advantageously be connected to a precharge mechanism 220 that typically may precharge all memory cells that are connected to a given even read bit line 180(a) or a given odd read bit line 180(b). Precharge mechanism 220 is typically not integral with a given memory cell 120, 126, but may readily be implemented in any suitable location, including locations that are external to the individual memory cells from memory core 116.

During a read operation, in order to ensure that a correct and accurate digital value is read from a given memory cell 120, 126, precharge mechanism 220 advantageously precharges a corresponding read bit line 180 prior to reading data stored in the particular memory cell 120, 126. In the FIG. 2 embodiment, precharge mechanism 220 may preferably be implemented using a P-channel metal oxide semiconductor (PMOS) device that may be connected to a bias voltage Vdd.

Precharge mechanism 220 may be driven by various versions of a memory clock (Mclock) 216(a), or an inverted memory clock 216(b) that also may provide clock pulses for synchronizing other functions of memory 110. In accordance with the present invention, for even memory cells 120(a), 120(b) from an even horizontal row of memory core 116, the PMOS device of precharge mechanism 220 may preferably be driven by an unaltered version of memory clock (Mclock) 216(a). However, for odd memory cells 126(a), 126(b) from an odd horizontal row of memory core 1 16, the PMOS device of precharge mechanism 220 may preferably be driven by an inverted version of memory clock 216(b). The utilization of an inverted memory clock 216(b) is further discussed below in conjunction with FIG. 4.

Figure 3:
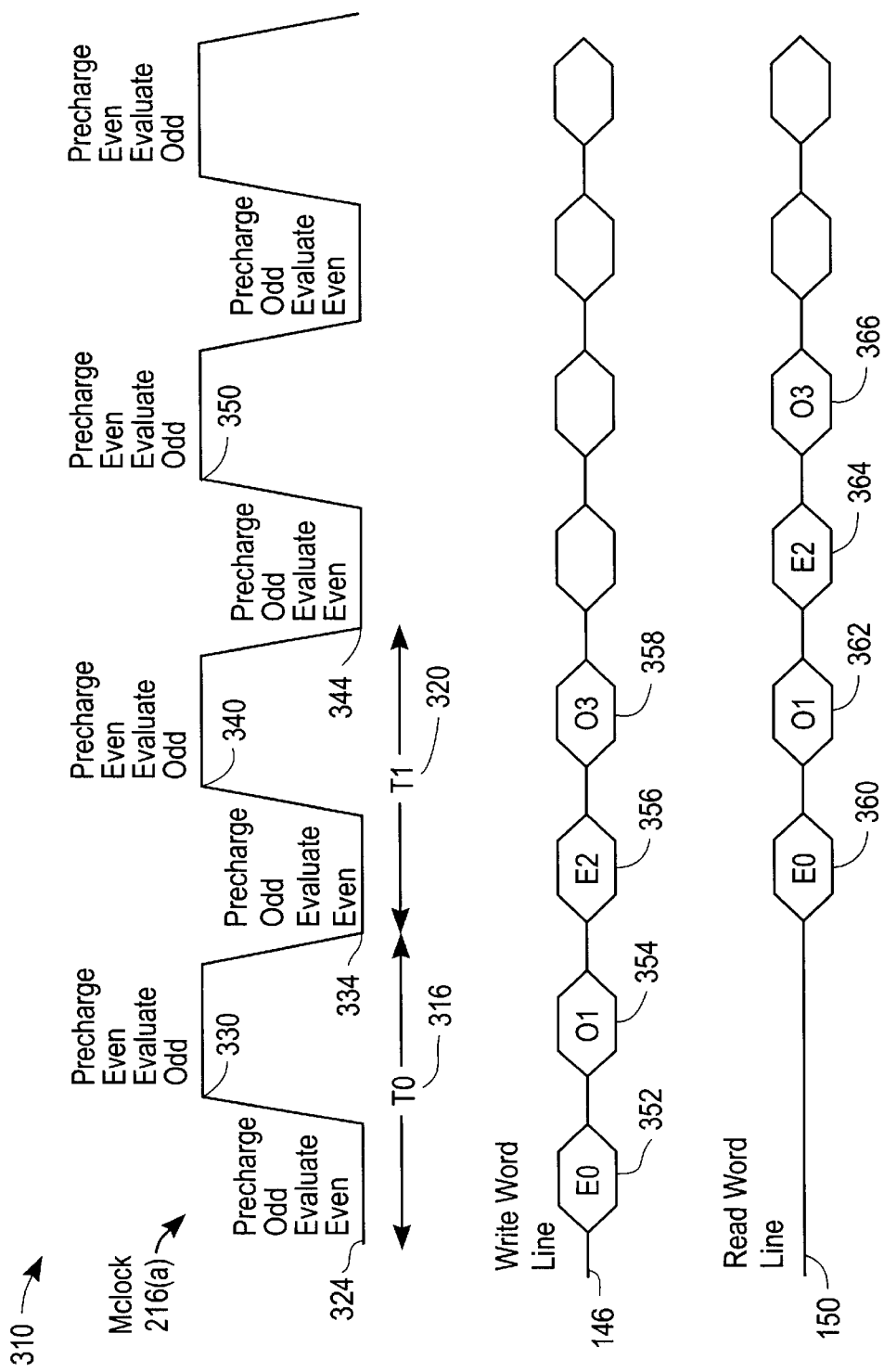
FIG. 3 is a waveform diagram for one embodiment of a memory clock, in accordance with the present invention.

Referring now to FIG. 3, a waveform diagram 310 for one embodiment of a memory clock (Mclock) 216(a) is shown, in accordance with the present invention. The FIG. 3 waveform diagram 310 is presented as an example to illustrate various principles of the present invention. However, in alternate embodiments, the present invention may readily utilize various other techniques and timing sequences in addition to, or instead of, those techniques and timing sequences discussed in conjunction with the FIG. 3 embodiment.

In the FIG. 3 example, Mclock 216(a) preferably includes a series of periodic clock cycles that each include a rising edge of a corresponding clock pulse and a falling edge of the same corresponding clock pulse. For example, in the FIG. 3 embodiment, a clock cycle T1 (320) preferably begins at time 334, extends through a rising edge of Mclock 216(a) at time 340, and then ends at a falling edge of Mclock 216(a) at time 344.

In accordance with the present invention, memory 110 may perform two separate data transfer operations during a single clock cycle by performing data transfer operations on successive rising and falling edges of Mclock 216(a) and by alternately utilizing the even memory cells and the odd memory cells discussed above in conjunction with FIGS. 1 and 2. Memory 110 may therefore advantageously perform data transfer operations at a doubled data rate to thereby provide a significantly increased data transfer speed.

As shown in FIG. 3, beginning at the start of clock cycle T0 from the falling edge of Mclock 216(a) at time 324, precharge mechanism 220 may preferably precharge the odd memory cells in memory core 116. Simultaneously, decoder 140 preferably may receive an even memory address, and responsively enable a corresponding even horizontal row of memory cells (for example, memory cells 120(a), 120(b)) in memory core 116 via an appropriate even word line. I/O circuit 166 may then evaluate the enabled even memory cells via an appropriate even bit line to thereby perform the appropriate data transfer operation. In the FIG. 3 example, the term "evaluate" typically may correspond to a read operation to retrieve stored data from a given memory cell. However, the FIG. 3 timing sequence for evaluating even and odd memory cells may similarly be applied to a write operation for storing data into a given memory cell. In the FIG. 3 example, a waveform for write word line 146 initially shows decoder 140 enabling an even horizontal row using E0 (352).

Then, from the rising edge of Mclock 216(a) at time 330, precharge mechanism 220 may preferably precharge all even memory cells in memory core 116. Simultaneously, decoder 140 preferably receives an odd memory address, and responsively enables a corresponding odd horizontal row of memory cells (for example, memory cells 126(a), 126(b)) in memory core 116 via an appropriate odd word line. I/O circuit 166 may then evaluate the enabled odd memory cells via an appropriate odd bit line to thereby perform the appropriate data transfer operation. In the FIG. 3 example, the waveform for write word line 146 shows decoder 140 enabling an odd horizontal row using O1 (354).

Next, as shown in FIG. 3, beginning at the start of clock cycle T1, from the falling edge of Mclock 216(a) at time 334, precharge mechanism 220 may preferably again precharge the odd memory cells in memory core 116. Simultaneously, decoder 140 preferably may receive an even memory address, and responsively enable a corresponding even horizontal row of memory cells (for example, memory cells 130(a), 130(b)) in memory core 116 via an appropriate even word line. I/O circuit 166 may then evaluate the enabled even memory cells via an appropriate even bit line to thereby perform an appropriate data transfer operation. In the FIG. 3 example, the waveform for write word line 146 shows decoder 140 enabling an even horizontal row using an E2 (356). A waveform for read word line 150 also shows that decoder 140 may alternately enable the even horizontal row using E0 (360) for a read operation.

Then, from the rising edge of Mclock 216(a) at time 340, precharge mechanism 220 may again preferably precharge the even memory cells in memory core 116. Simultaneously, decoder 140 preferably may receive an odd memory address, and responsively enable a corresponding odd horizontal row of memory cells (for example, memory cells 134(a), 134(b)) in memory core 116 via an appropriate odd word line. I/O circuit 166 may then evaluate the enabled odd memory cells via an appropriate odd bit line to thereby perform an appropriate data transfer operation. In the FIG. 3 example, the waveform for write word line 146 shows decoder 140 enabling an odd horizontal row using O3 (358). A waveform for read word line 150 shows that decoder 140 may alternately enable the odd horizontal row using O1 (362) for a read operation.

Memory 110 may thus alternately precharge odd memory cells while evaluating even memory cells in memory core 116, and may then precharge even memory cells while evaluating odd memory cells in memory core 116, in synchronization with successive rising and falling edges of Mclock 216(a), to thereby provide increased throughput during data transfer operations, in accordance with the present invention.

The FIG. 3 embodiment is provided as an example of principles of the present invention. In other embodiments, the present invention may utilize various different sequences to implement a double data rate memory architecture. For example, the even/odd precharging and evaluation sequence discussed in conjunction with the FIG. 3 embodiment may readily be reversed to occur on the opposite rising/falling edges of Mclock 216(a), so that even memory cells are evaluated on a rising edge of Mclock 216(a), and odd memory cells are evaluated on a falling edge of Mclock 216(a). In addition, a clock cycle of Mclock 216(a) may alternately be designated to start on a rising edge, instead of beginning on a falling edge, as shown in the FIG. 3 embodiment.

Referring again to FIG. 1, in conjunction with the FIG. 3 waveform 310, the present invention advantageously provides an implementation of memory 110 that advantageously exhibits reduced current draw and improved power supply loading qualities in relationship to the amount of data transferred per transfer operation. The foregoing reduced power consumption is due in part to the need for charging and discharging only half of a vertical column of memory cells from memory core 116 during a given data transfer operation. For example, during a read operation to vertical column B of memory core 116 (FIG. 1), only even memory cells 120(b) and 130(b) need to be charged and discharged, thereby conserving significant amounts of power that would otherwise be required to also charge and discharge memory cells 126(b) and 134(b) of vertical column B from memory core 116.

Figure 4:
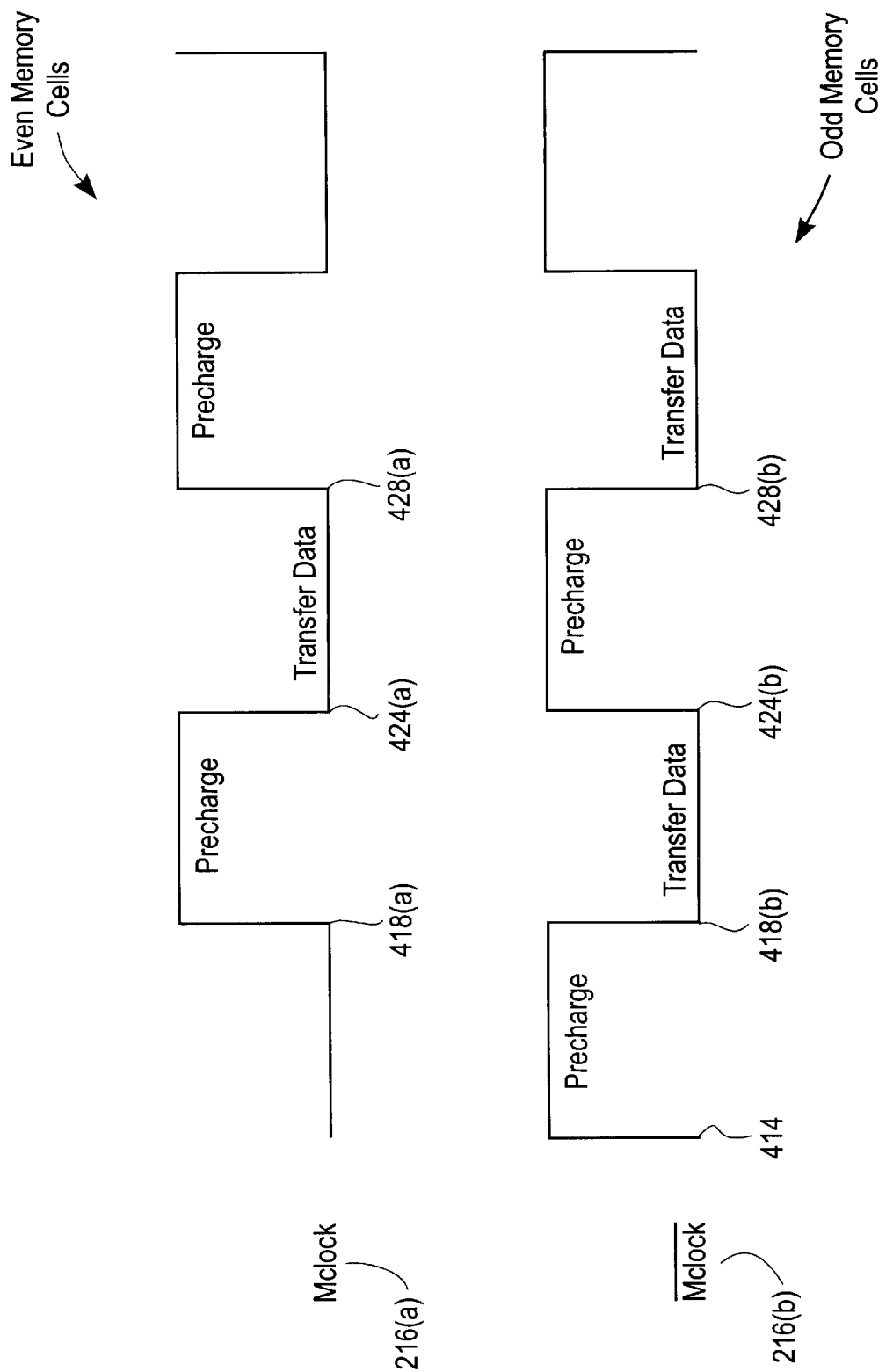
FIG. 4 is a waveform diagram for one embodiment of a memory clock and an inverted memory clock, in accordance with the present invention.

Referring now to FIG. 4, a waveform diagram for one embodiment of a memory clock 216(a) and an inverted memory clock 216(b) is shown, in accordance with the present invention. In alternate embodiments, the present invention may utilize various other techniques and timing sequences in addition to, or instead of, those techniques and timing sequences discussed in conjunction with the FIG. 4 embodiment.

As discussed above in conjunction with FIG. 2, a non-altered Mclock 216(a) is preferably provided to various circuits in memory 110. For example, Mclock 216(a) preferably may drive precharge mechanisms 220 that are connected to the even read bit lines (RBL Even) 180(a) from even memory cells of memory core 116. As shown in the FIG. 4 example, Mclock 216(a) may preferably trigger precharge mechanism 220 to begin precharging even memory cells on a rising edge of Mclock 216(a) at time 418(a). Then, Mclock 216(a) may preferably trigger memory 110 to begin performing an appropriate read or write data transfer at time 424(a) on a falling edge of Mclock 216(a). Memory 110 thereafter may preferably repeat the precharge/transfer timing sequence for the even memory cells in memory core 116 by synchronizing the precharge/transfer operations of the even memory cells to rising and falling edges of Mclock 216(a), as shown in FIG. 4.

As discussed above in conjunction with FIG. 2, an inverted Mclock 216(b) may preferably be provided to various other circuits of memory 110. For example, inverted Mclock 216(b) may preferably drive precharge mechanisms 220 that are connected to the odd read bit lines (RBL Odd) 180(b) from odd memory cells of memory core 116. As shown in the FIG. 4 example, inverted Mclock 216(b) may preferably trigger precharge mechanism 220 to begin precharging odd memory cells on a rising edge of inverted Mclock 216(b) at time 418(b). Then, inverted Mclock 216(b) may preferably trigger memory 110 to begin performing an appropriate read or write data transfer at time 424(b) on a falling edge of inverted Mclock 216(b). Memory 110 thereafter may preferably repeat the precharge/transfer timing sequence for the odd memory cells in memory core 116 by synchronizing the precharge/transfer operations of the odd memory cells to rising and falling edges of inverted Mclock 216(b), as shown in FIG. 4.

In the FIG. 4 embodiment, it should be noted that the rising edges of Mclock 216(a) are synchronized and in opposite relation to the falling edges of inverted Mclock 216(b). For example, the rising edge of Mclock 216(a) at time 418(a) is preferably synchronized with the falling edge of inverted Mclock 216(b) at time 418(b). Therefore, in accordance with the present invention, while the even memory cells are precharging, a data transfer operation is preferably occurring in the odd memory cells. Similarly, while the odd memory cells are precharging, a data transfer operation is preferably occurring in the even memory cells. The present invention thus provides a doubled data transfer rate by advantageously dividing memory cells in memory core 116 into even and odd groupings, and then alternately performing data transfer operations on both rising and falling edges of the memory clock, using the even and odd groupings of memory cells.

Figure 5:
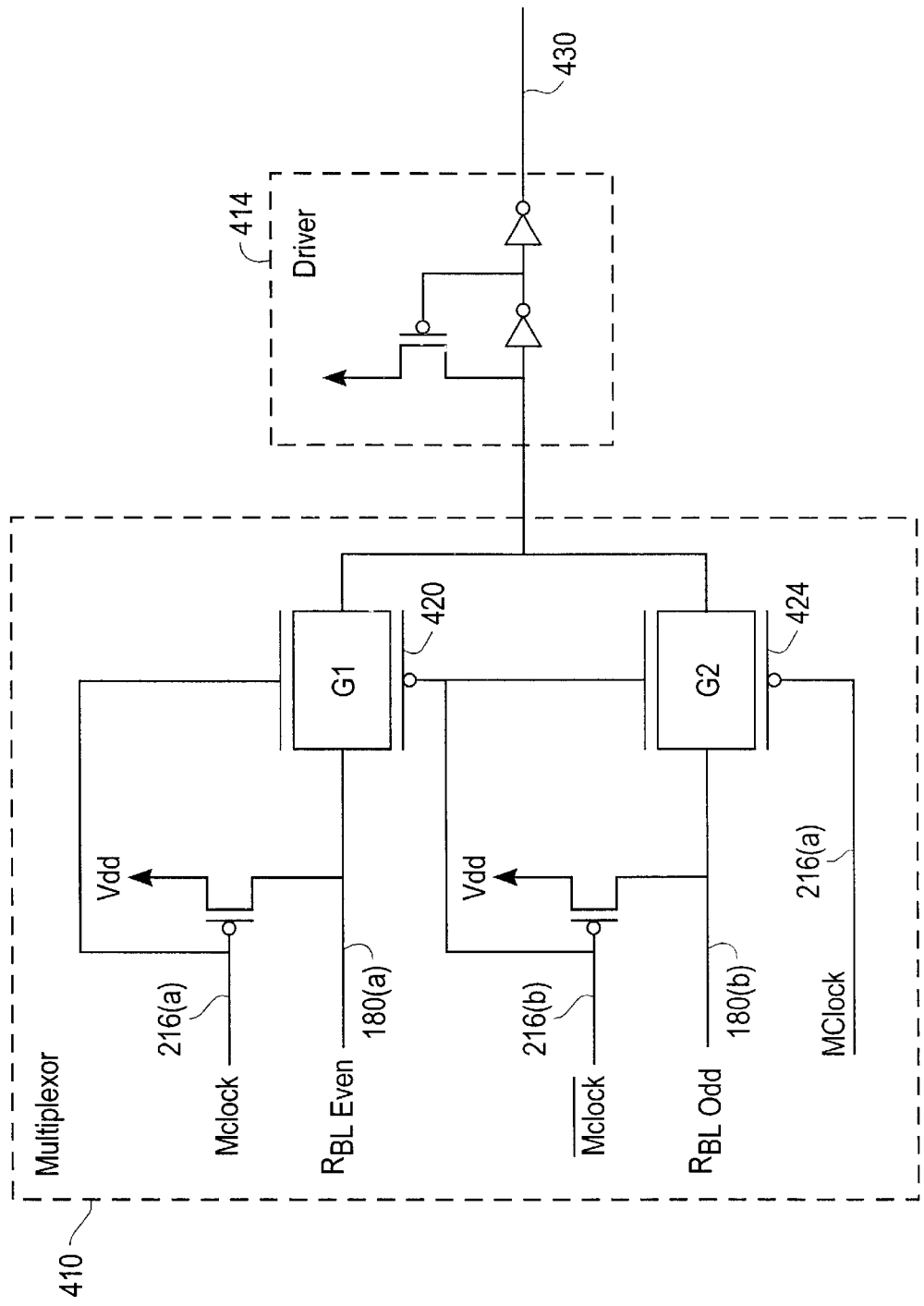
FIG. 5 is a schematic diagram for one embodiment of a multiplexor, in accordance with the present invention.

Referring now to FIG. 5, a schematic diagram for one embodiment of a multiplexor 410 is shown, in accordance with the present invention. In alternate embodiments, multiplexor 410 may readily be implemented to include various other configurations and components in addition to, or instead of, those configurations and components discussed in conjunction with the FIG. 5 embodiment.

In the FIG. 5 embodiment, a separate multiplexor 410 may preferably be implemented as part of I/O circuit 166 to select an appropriate even read bit line 180(*a*) or odd read bit line 180(*b*) for each vertical column of memory cells in memory core 116 (see FIG. 1), to thereby transfer selected data from memory core 116 to a data destination during a read operation.

In the FIG. 5 embodiment, a G1 transmission gate 420 preferably may receive transfer data from an even read bit line (RBL Even) 180(*a*). The G1 transmission gate 420 is also connected to both Mclock 216(*a*) and inverted Mclock 216(*b*) on opposing terminals to thereby select or deselect the G1 transmission gate 420. Similarly, a G2 transmission gate 424 preferably may receive transfer data from an odd read bit line (RBL Odd) 180(*b*). The G2 transmission gate 424 is connected to both inverted Mclock 216(*b*) and Mclock 216(*a*) on opposing terminals to thereby select or deselect the G2 transmission gate 424.

In accordance with the present invention, depending upon the occurrence of either the rising edge or the falling edge of Mclock 216(*a*), multiplexor 410 may thus provide selected transfer data from a corresponding one of RBL Even 180(*a*) or RBL Odd 180(*b*) to a driver circuit 414. In the FIG. 5 embodiment, the driver circuit 414 may then transmit the selected transfer data from I/O circuit 166 to the particular data destination to complete the read operation.

Figure 6:
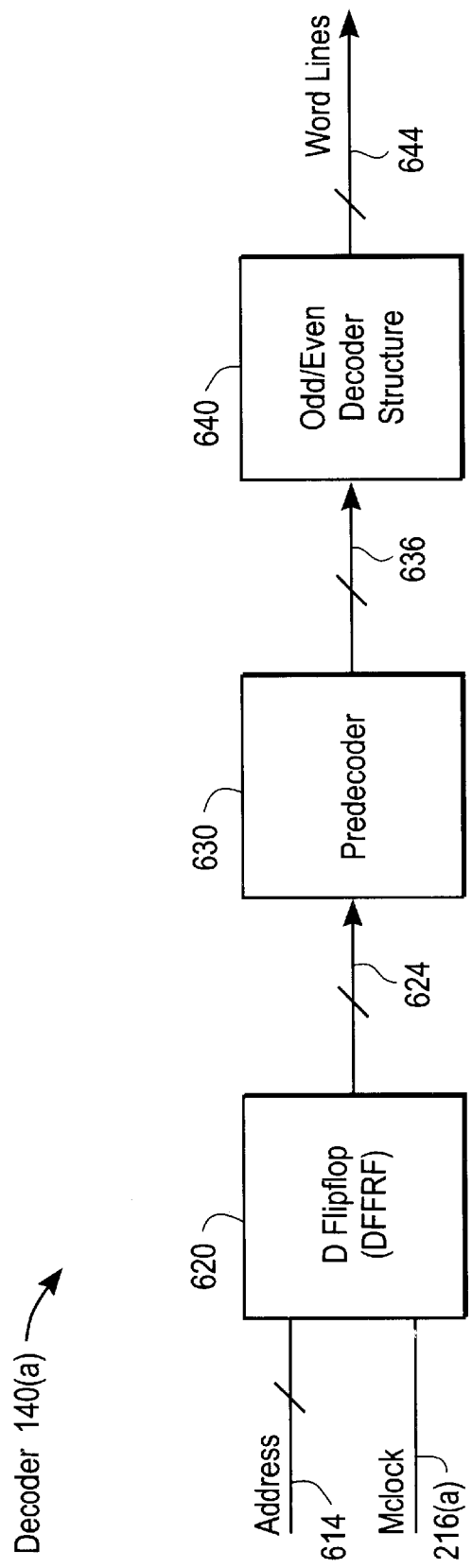
FIG. 6 is a block diagram for one embodiment of the decoder of FIG. 1, in accordance with the present invention.

Referring now to FIG. 6, a block diagram for one embodiment of the FIG. 1 decoder 140(*a*) is shown, in accordance with the present invention. In the FIG. 6 embodiment, decoder 140(*a*) preferably may include a rising/falling edge D flipflop (DFFRF) 620, a predecoder 630, and an odd/even decoder structure 640. In alternate embodiments, decoder 140(*a*) may readily be implemented to include various other configurations and components in addition to, or instead of, those configurations and components discussed in conjunction with the FIG. 6 embodiment.

In typical operation of the FIG. 6 embodiment, DFFRF 620 preferably may receive an even or odd memory address from an external source (such as a host processor or a memory controller device) via path 614 to thereby designate a particular even or odd horizontal row of memory cells in memory core 116 for performing a read operation or a write operation. DFFRF 620 preferably also receives Mclock 216(*a*) and responsively synchronizes the even or odd memory address with an appropriate corresponding rising or falling edge of Mclock 216(*a*) to thus provide a synchronized memory address to predecoder 630 via path 624. One embodiment of DFFRF 620 is further discussed below in conjunction with FIG. 7.

In the FIG. 6 embodiment, predecoder 630 preferably receives the synchronized memory address from DFFRF 620, and responsively may perform a predecoding procedure to predecode the synchronized memory address into an appropriate number of individual word lines which may then be provided to odd/even decoder structure 640 via path 636. Odd/even decoder structure 640 may then responsively perform various manipulation procedures upon the predecoded word lines received from predecoder 630.

For example, odd/even decoder structure 640 may buffer the predecoded word lines to provide buffered word lines to memory core 116 via path 644. The buffered word lines on path 644 may preferably include even write word line E0 (146(*a*)), even read word line E0 (150(*a*)), odd write word line O1 (146(*b*)), and odd read word line (150(*b*)) from the FIG. 1 embodiment of memory 110.

Figure 7:
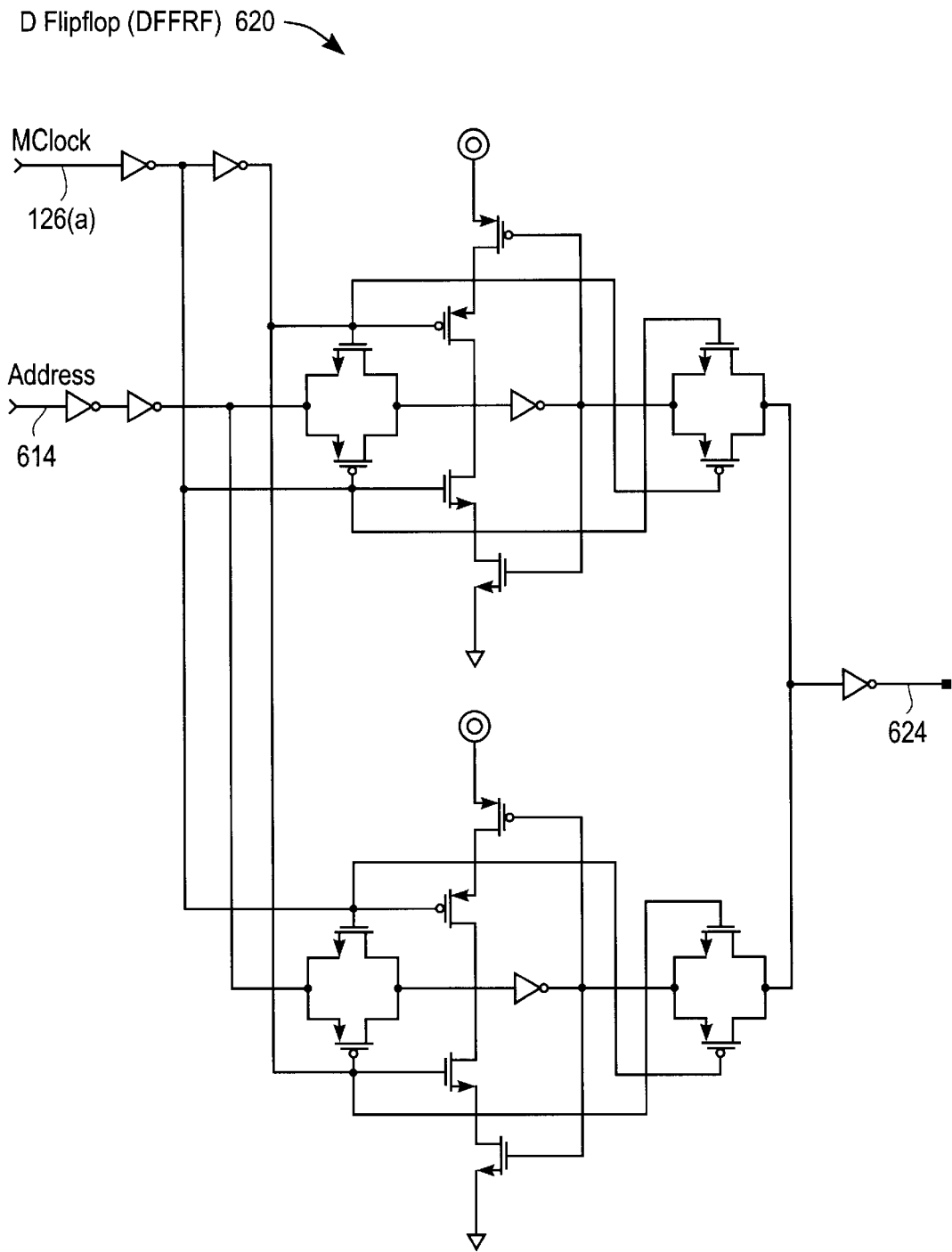
FIG. 7 is a schematic diagram for one embodiment of the D flipflop of FIG. 6, in accordance with the present invention.

Referring now to FIG. 7, a schematic diagram for one embodiment of the FIG. 6 rising/falling edge D flipflop (DFFRF) 620 is shown, in accordance with the present invention. In the FIG. 7 embodiment, DFFRF 620 is shown as being efficiently implemented using a master portion of a master-slave D flipflop. In alternate embodiments, DFFRF 620 may readily be implemented to include various other configurations and components in addition to, or instead of, those configurations and components discussed in conjunction with the FIG. 7 embodiment.

As discussed above in conjunction with the FIG. 6 embodiment, DFFRF 620 preferably may receive an even or odd memory address from an external source (such as a host processor or a memory controller device) via path 614 to thereby designate a particular even or odd horizontal row of memory cells in memory core 116 for performing a read operation or a write operation. DFFRF 620 preferably also receives Mclock 216(*a*) at a separate input, and responsively synchronizes the even or odd memory address with an appropriate corresponding rising or falling edge of Mclock 216(*a*) to thus provide a synchronized memory address to predecoder 630 via path 624.

Figure 8:
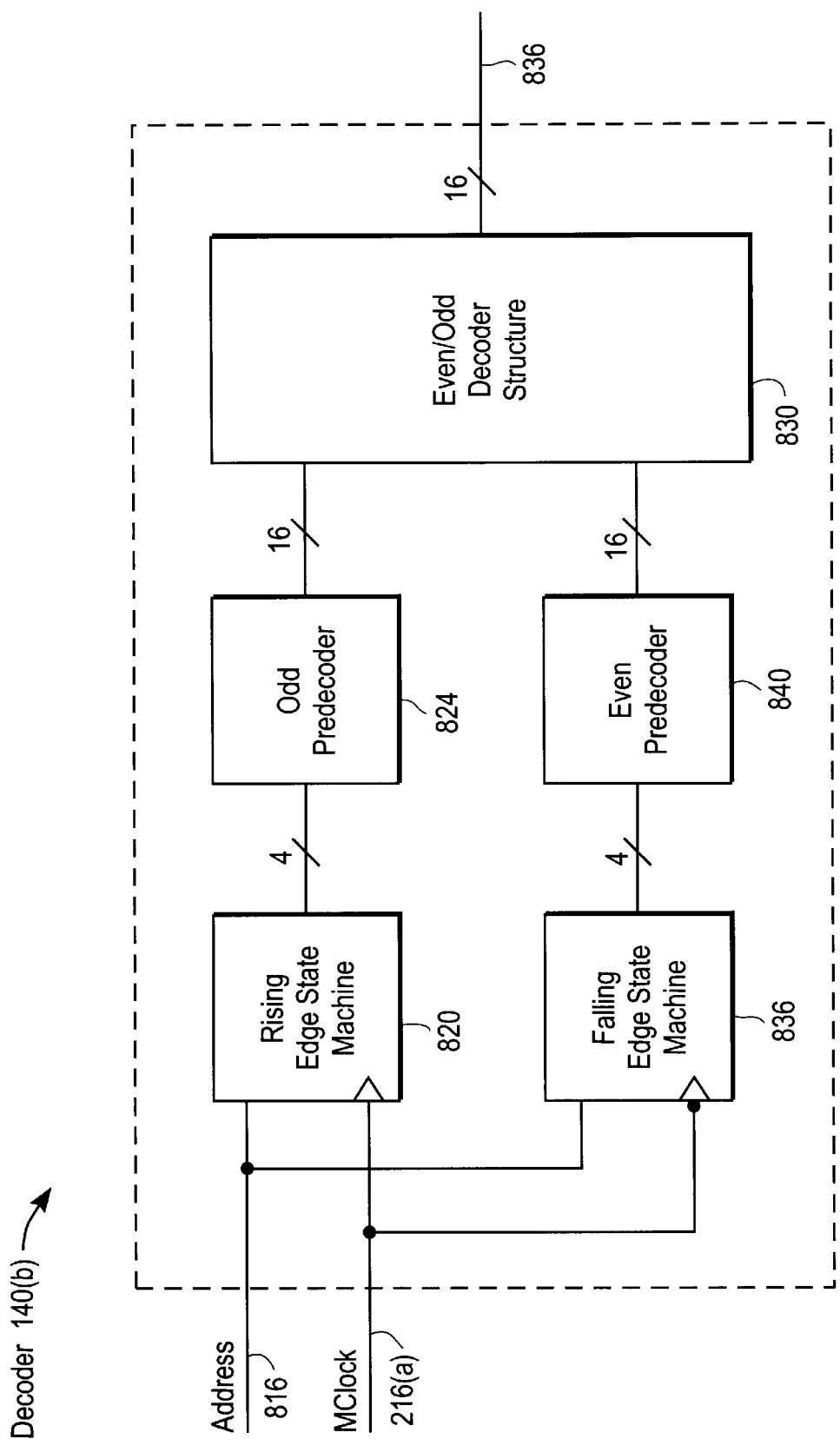
FIG. 8 is a block diagram for one embodiment of the decoder of FIG. 1, in accordance with the present invention.

Referring now to FIG. 8, a block diagram for one embodiment of the FIG. 1 decoder 140(*b*) is shown, in accordance with the present invention. In the FIG. 8 embodiment, decoder 140(*b*) preferably may include a rising edge state machine 820, an odd predecoder 824, a falling edge state machine 836, an even predecoder 840, and an odd/even decoder structure 830. In alternate embodiments, decoder 140(*b*) may readily be implemented to include various other configurations and components in addition to, or instead of, those configurations and components discussed in conjunction with the FIG. 8 embodiment.

In accordance with the present invention, decoder 140(*b*) preferably may be effectively utilized when a given data transfer operation in memory 110 progresses either sequentially up or sequentially down from a given starting memory address to access a regular series of the horizontal rows of memory cells in memory core 116.

In typical operation of the FIG. 8 embodiment, both rising edge state machine 820 and falling edge state machine 836 preferably may receive an even or odd starting memory address from an external source (such as a host processor or a memory controller device) via path 816 to thereby designate a particular even or odd horizontal row of memory cells in memory core 116 for starting a read operation or a write operation. Rising edge state machine 820 and falling edge state machine 836 preferably also both receive Mclock 216(*a*) at a separate input.

Either rising edge state machine 820 or falling edge state machine 836 may responsively generate a series of sequentially rising or sequentially falling even or odd memory addresses to thus provide a memory address sequence to either odd predecoder 824 or even predecoder 840. Embodiments for rising edge state machine 820 and falling edge state machine 836 are further discussed below in conjunction with FIG. 9.

In the FIG. 8 embodiment, either odd predecoder 824 or even predecoder 840 preferably receives the foregoing memory address sequence from a corresponding rising edge state machine 820 or falling edge state machine 836, and may responsively perform a predecoding procedure to predecode the memory address sequence into an appropriate number of individual word lines which may then be provided to odd/even decoder structure 830. Odd/even decoder structure 830 may then responsively perform various manipulation procedures upon the predecoded word lines received from even predecoder 824 or odd predecoder 840.

For example, odd/even decoder structure 830 may buffer the predecoded word lines to provide buffered word lines to memory core 116 via path 836. The buffered word lines on path 836 may preferably include even write word line E0 (146(*a*)), even read word line E0 (150(*a*)), odd write word line O1 (146(*b*)), and odd read word line (150(*b*)) from the FIG. 1 embodiment of memory 110.

Figure 9:
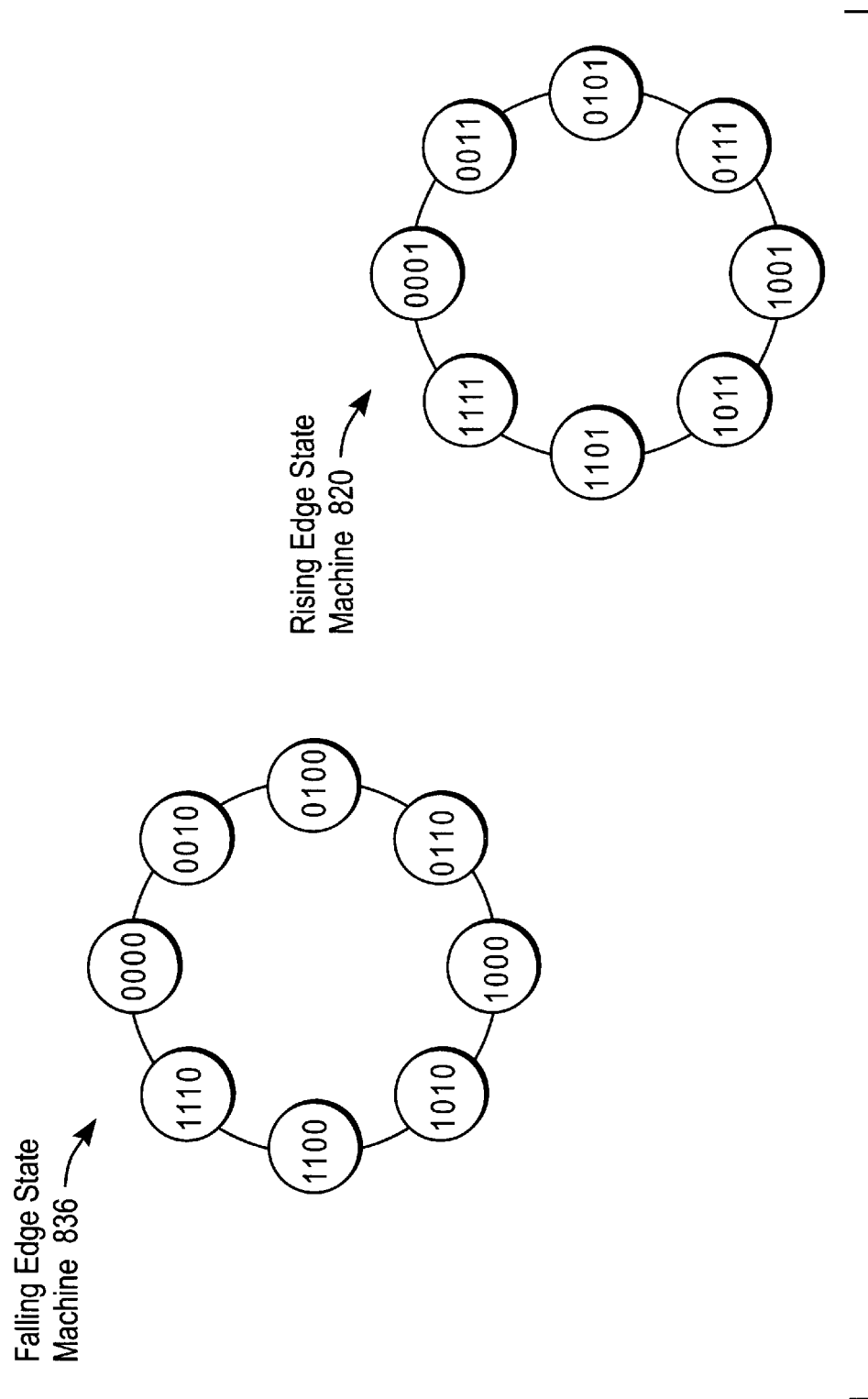
FIG. 9 is a diagram for one embodiment of the state machines of FIG. 8, in accordance with the present invention.

Referring now to FIG. 9, a diagram for one embodiment of the FIG. 8 state machines 820, 836 is shown, in accordance with the present invention. In alternate embodiments, state machines 820, 836 may readily include various other implementations and output sequences in addition to, or instead of, those implementations and output sequences discussed in conjunction with the FIG. 9 embodiment.

For example, in the FIG. 9 embodiment, falling edge state machine 836 preferably generates an even memory address sequence, and rising edge state machine 820 preferably generates an odd memory address sequence. However, in various other embodiments, falling edge state machine 836 may alternately generate an odd memory address sequence, and rising edge state machine 820 may alternately generate an even memory address sequence.

In the FIG. 9 embodiment, falling edge state machine 836 preferably generates a regular series of even memory addresses beginning with a starting memory address of binary 0000 (decimal zero), and proceeding through binary 0010 (decimal 2), binary 0100 (decimal 4), binary 0110 (decimal 6), binary 1000 (decimal 8), binary 1010 (decimal 10), binary 1100 (decimal 12), and binary 1110 (decimal 14). In alternate embodiments, falling edge state machine 836 may continue producing even memory addresses in an increasing sequence, as shown in FIG. 9. Alternately, falling edge state machine 836 may similarly produce a series of even memory addresses in a decreasing sequence from a given starting memory address.

In the FIG. 9 embodiment, rising edge state machine 820 preferably generates a regular series of odd memory addresses beginning with a starting memory address of binary 0001 (decimal one), and proceeding through binary 0011 (decimal 3), binary 0101 (decimal 5), binary 0111 (decimal 7), binary 1001 (decimal 9), binary 1011 (decimal 11), binary 1101 (decimal 13), and binary 1111 (decimal 15). In alternate embodiments, rising edge state machine 820 may continue producing odd memory addresses in an increasing sequence, as shown in FIG. 9. Alternately, rising edge state machine 820 may similarly produce a series of odd memory addresses in a decreasing sequence from a given starting memory address.

Figure 10:
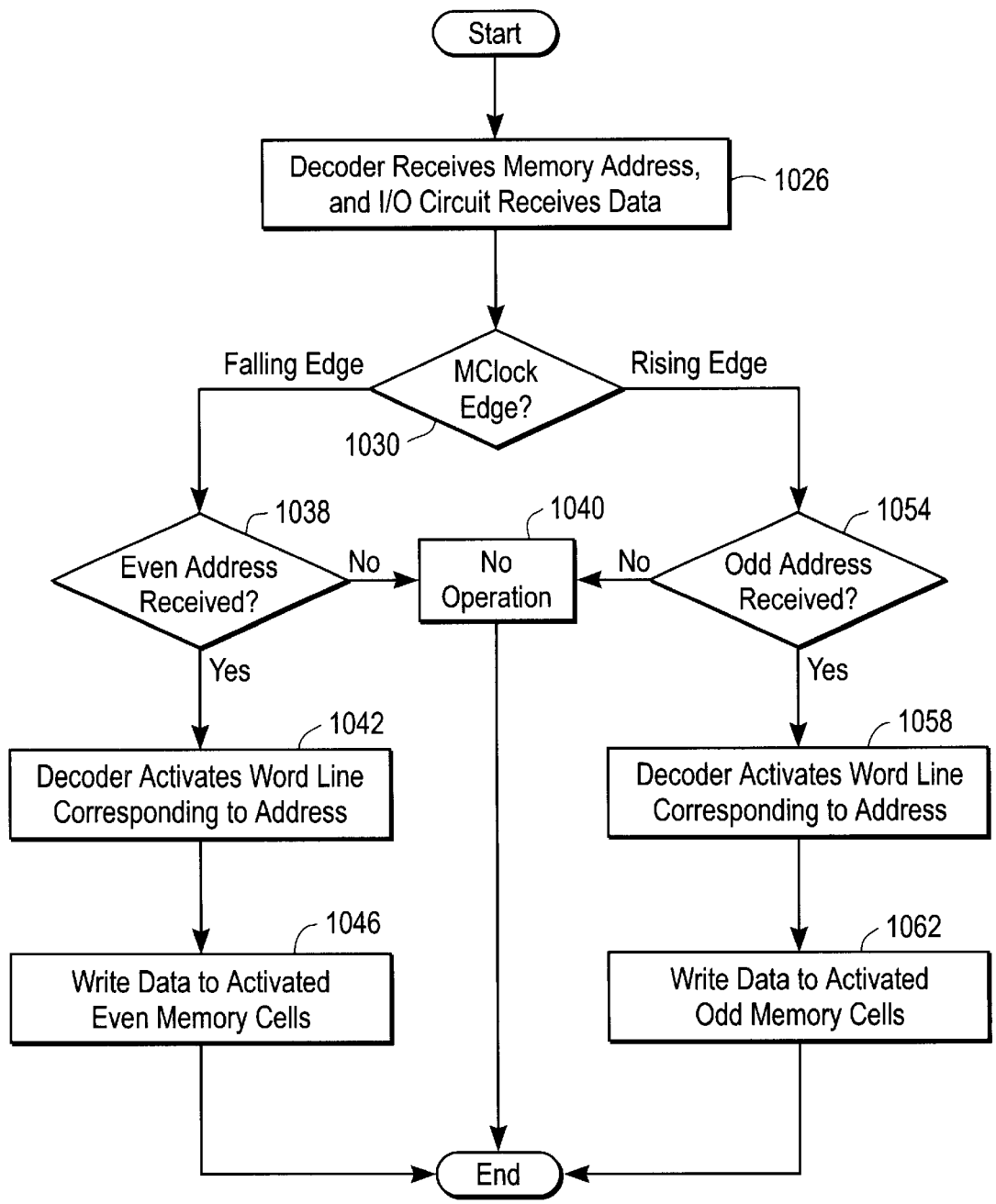
FIG. 10 is a flowchart of method steps for performing a write operation, in accordance with one embodiment of the present invention.

Referring now to FIG. 10, a flowchart of method steps for performing a write operation using memory 110 is shown, in accordance with one embodiment of the present invention. The FIG. 10 embodiment is presented for purposes of illustration, and, in alternate embodiments, the present invention may readily utilize various other steps and sequences than those discussed in conjunction with the FIG. 10 embodiment.

For example, in the FIG. 10 embodiment, even memory cells of memory core 116 are preferably accessed on a falling edge of Mclock 216(*a*), and odd memory cells of memory core 116 are preferably accessed on a rising edge of Mclock 216(*a*). However, in alternate embodiments, the present invention may readily access even memory cells of memory core 116 on a rising edge of Mclock 216(*a*), and access odd memory cells of memory core 116 on a falling edge of Mclock 216(*a*).

In the FIG. 10 embodiment, initially, in step 1026, decoder 140 preferably may receive a memory address from an address source for writing transfer data into a horizontal location of memory cells in memory core 116. In addition, in step 1026, I/O circuit 166 preferably may receive the foregoing transfer data from a data source for performing the write operation.

In step 1030, memory 110 preferably determines a current clock edge state for a memory clock (Mclock) 216(*a*). If the current clock edge state is synchronized with a falling edge of Mclock 216(*a*), then, in step 1038, decoder 140 preferably determines whether an even Memory address has been received from the foregoing address source. If an even memory address has not been received from the address source, then, in step 1040, memory 110 preferably performs no data transfer operation.

However, in foregoing step 1038, if an even memory address has been received from the address source, then, in step 1042, decoder 140 preferably may activate an even write word line that corresponds to the received even memory address to thereby select an appropriate even horizontal row of memory cells in memory core 116. Finally, in step 1046, I/O circuit 166 preferably may write the received transfer data into the selected even horizontal row of memory cells in memory core 116 to complete the write operation.

In foregoing step 1030, if the current clock edge state is synchronized with a rising edge of Mclock 216(*a*), then, in step 1054, decoder 140 preferably determines whether an odd memory address has been received from the foregoing address source. If an odd memory address has not been received from the address source, then, in step 1040, memory 110 preferably performs no data transfer operation.

However, in foregoing step 1054, if an odd memory address has been received from the address source, then, in step 1058, decoder 140 preferably may activate an odd write word line that corresponds to the received odd memory address to thereby select an appropriate odd horizontal row of memory cells in memory core 116. Finally, in step 1062, I/O circuit 166 preferably may write the received transfer data into the selected odd horizontal row of memory cells in memory core 116 to complete the write operation. In accordance with the present invention, the foregoing FIG. 10 process may then be repeated to alternately perform further data transfer operations to appropriate even horizontal rows or odd horizontal rows of memory core 116.

Figure 11:
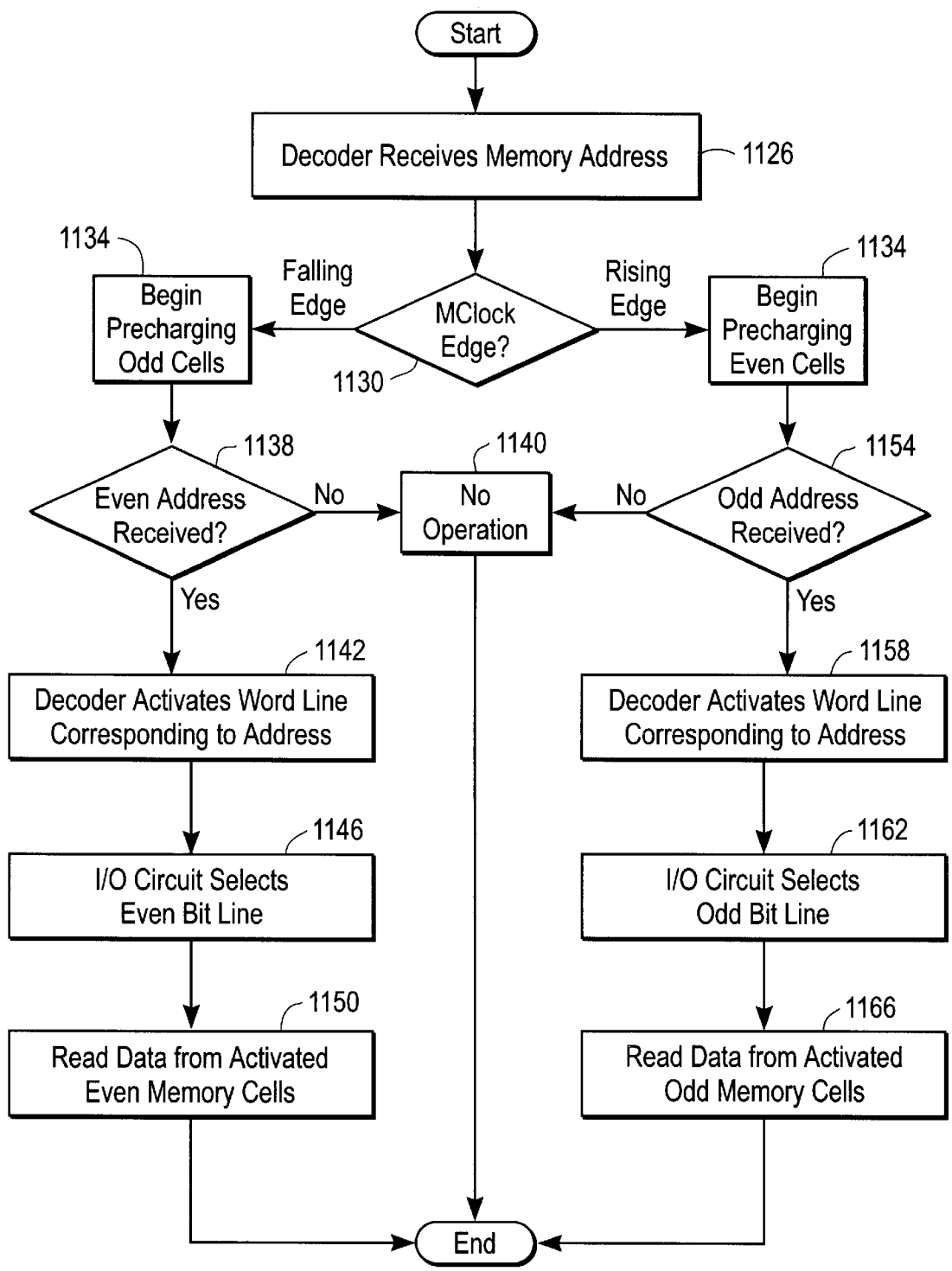
FIG. 11 is a flowchart of method steps for performing a read operation, in accordance with one embodiment of the present invention.

Referring now to FIG. 11, a flowchart of method steps for performing a read operation using memory 110 is shown, in accordance with one embodiment of the present invention. The FIG. 11 embodiment is presented for purposes of illustration, and, in alternate embodiments, the present invention may readily utilize various other steps and sequences than those discussed in conjunction with the FIG. 11 embodiment.

For example, in the FIG. 11 embodiment, even memory cells of memory core 116 are preferably accessed on a falling edge of Mclock 216(*a*), and odd memory cells of memory core 116 are preferably accessed on a rising edge of Mclock 216(*a*). However, in alternate embodiments, the present invention may readily access even memory cells of memory core 116 on a rising edge of Mclock 216(*a*), and access odd memory cells of memory core 116 on a falling edge of Mclock 216(*a*).

In the FIG. 11 embodiment, initially, in step 1126, decoder 140 preferably may receive a memory address from an address source for reading transfer data from a horizontal location of memory cells in memory core 116. In step 1130, memory 110 preferably may determine a current clock edge state for a memory clock (Mclock) 216(*a*).

If the current clock edge state is synchronized with a falling edge of Mclock 216(*a*), then, in step 1134, precharge mechanisms 220 preferably may begin precharging odd memory cells in memory core 116. Then, in step 1138, decoder 140 preferably may determine whether an even memory address has been received from the foregoing address source. If an even memory address has not been received from the address source, then, in step 1140, memory 110 preferably performs no data transfer operation.

However, in foregoing step 1138, if an even memory address has been received from the address source, then in step 1142, decoder 140 preferably may activate an even write word line that corresponds to the received even memory address to thereby select an appropriate even horizontal row of memory cells in memory core 116.

Next, in step 1146, multiplexor 410 in I/O circuit 166 preferably may select an even read bit line 180(*a*) for accessing transfer data from the selected horizontal row of memory cells in memory core 116. Finally, in step 1150, I/O circuit 166 preferably may access and read the transfer data from the selected even horizontal row of memory cells in memory core 116 to complete the read operation.

In foregoing step 1130, if the current clock edge state is synchronized with a rising edge of Mclock 216(*a*), then, in step 1136, precharge mechanisms 220 preferably may begin precharging odd memory cells in memory core 116. Then, in step 1154, decoder 140 preferably may determine whether an odd memory address has been received from the foregoing address source. If an odd memory address has not been received from the address source, then, in step 1140, memory 110 preferably performs no data transfer operation.

However, in foregoing step 1154, if an odd memory address has been received from the address source, then, in step 1158, decoder 140 preferably may activate an odd write word line that corresponds to the received odd memory address to thereby select an appropriate odd horizontal row of memory cells in memory core 116.

Next, in step 1162, multiplexor 410 in I/O circuit 166 preferably may select an odd read bit line 180(*b*) for accessing transfer data from the selected horizontal row of memory cells in memory core 116. Finally, in step 1066, I/O circuit 166 preferably may read the transfer data from the selected odd horizontal row of memory cells in memory core 116 to complete the read operation. In accordance with the present invention, the foregoing FIG. 11 process may then be repeated to alternately perform further data transfer operations from appropriate even horizontal rows or odd horizontal rows of memory core 116.

The invention has been explained above with reference to a preferred embodiment. Other embodiments will be apparent to those skilled in the art in light of this disclosure. For example, the present invention may readily be implemented using configurations other than those described in the preferred embodiment above. Additionally, the present invention may effectively be used in conjunction with systems other than the one described above as the preferred embodiment. Therefore, these and other variations upon the preferred embodiments are intended to be covered by the present invention, which is limited only by the appended claims.

What is claimed is:

1. A system for implementing a memory device to perform a data transfer operation, comprising:

memory cells coupled to said memory device, said memory cells being divided into a first cell group and a second cell group for storing information; and a control device coupled to said memory cells for accessing said first cell group on a first edge of a memory clock to transfer said information, said control device accessing said second cell group on a second edge of said memory clock to transfer said information.

2. The system of claim 1 wherein said first cell group includes even horizontal rows of said memory cells from said memory device, and wherein said second cell group includes odd horizontal rows of said memory cells from said memory device.

3. The system of claim 2 wherein said memory clock includes a periodic clock pulse, said first edge of said memory clock being a falling edge of said periodic clock pulse, said second edge of said memory clock being a rising edge of said periodic clock pulse.

4. The system of claim 2 wherein said memory clock includes a periodic clock pulse, said first edge of said memory clock being a rising edge of said periodic clock pulse, said second edge of said memory clock being a falling edge of said periodic clock pulse.

5. The system of claim 1 wherein said memory device is implemented as a local synchronous dynamic random-access memory in an integrated circuit device.

6. The system of claim 2 wherein said memory device comprises a decoder device, an input/output circuit, and a memory core that includes a matrix of said memory cells.

7. The system of claim 6 wherein said memory cells in said memory core are arranged in said even horizontal rows and said odd horizontal rows that occur in an alternating sequence in said memory core, said even horizontal rows each being enabled by separate even word lines from said decoder, said odd horizontal rows each being enabled by separate odd word lines from said decoder, said even horizontal rows each being accessed by separate even bit lines from said input/output circuit to transfer said information, said odd horizontal rows each being accessed by separate odd bit lines from said decoder to transfer said information.

8. The system of claim 7 wherein said memory cells are each coupled to said decoder through read word lines to enable a read operation and write word lines to enable a write operation, said memory cells being each coupled to said input/output circuit through read bit lines for transferring read data and write bit lines for transferring write data, said write bit lines also being inverted and supplied to each of said memory cells to provide a complement value for said write data.

9. The system of claim 8 wherein said each of said memory cells is implemented as a low-footprint memory cell to minimize a required cell size on a host integrated circuit, said low-footprint memory cell being implemented using two NMOS devices and two inverters in a write portion, said low-footprint memory cell being implemented using two NMOS devices in a read portion of said low-footprint memory cell.

10. The system of claim 7 wherein each of said even bit lines and said odd bit lines to said memory cells is also connected to a precharge mechanism that performs a precharge procedure for each of said memory cells to ensure that an accurate value for said information is read from said memory cells, said precharge mechanism including a PMOS device that is driven by said memory clock for said memory cells in said even horizontal rows, said PMOS device being driven by an inverted memory clock for said memory cells in said odd horizontal rows.

11. The system of claim 10 wherein said memory device alternately and repeatedly performs a first precharge/transfer procedure on said first edge of said memory and a second precharge/transfer procedure on said second edge of said memory clock, said first precharge/transfer procedure including simultaneously performing said precharge procedure on said odd horizontal rows of said memory cells and performing an even data transfer using a selected one of said even horizontal rows of said memory cells, said second precharge/transfer procedure including simultaneously performing said precharge procedure on said even horizontal rows of said memory cells and performing an odd data transfer using a selected one of said odd horizontal rows of said memory cells.

12. The system of claim 11 wherein said memory device utilizes an inverted memory clock for performing one of said first precharge/transfer procedure and said second precharge/transfer procedure.

13. The system of claim 6 wherein said input/output circuit includes a multiplexor that selects between an even read bit line and an odd read bit line to output said information during a read operation, said input/output circuit also including a buffer system to buffer said information during a write operation.

14. The system of claim 13 wherein said multiplexor includes a first transmission gate that is coupled to said even read bit line, said first transmission gate being controlled by said memory clock and an inverted memory clock that are coupled to opposing terminals of said first transmission gate, said multiplexor also including a second transmission gate that is coupled to said odd read bit line, said second transmission gate being controlled by said inverted memory clock and said memory clock that are coupled to opposing terminals of said second transmission gate, said multiplexor thereby providing a selected read output signal to a data destination through a driver circuit.

15. The system of claim 6 wherein said decoder includes a rising/falling edge flipflop, a predecoder, and an odd/even decoder structure, said predecoder receiving a synchronized memory address from said rising/falling edge flipflop, and responsively generating individual predecoded word lines that are buffered by said odd/even decoder structure before being transmitted to enable selected ones of said memory cells.

16. The system of claim 15 wherein said rising/falling edge flipflop is implemented as a master portion of a D flipflop that receives a memory address from an address source and responsively synchronizes said memory address to an appropriate one of said first edge and said second edge of said memory clock to generate said synchronized memory address, said rising/falling edge flipflop synchronizing an even memory address to said first edge of said memory clock, said rising/falling edge flipflop synchronizing an odd memory address to said second edge of said memory clock.

17. The system of claim 6 wherein said decoder includes a rising edge state machine and a falling edge state machine that each receive a starting address from an address source, said rising edge state machine generating an odd memory address sequence for an odd starting address, said falling edge state machine generating an even memory address sequence for an even starting address, said rising edge state machine providing said odd memory address sequence to an odd predecoder, said falling edge state machine providing said even memory address sequence to an even predecoder, said odd predecoder and said even predecoder responsively providing a predecoded memory address to an odd/even decoder structure that buffers and transmits corresponding word lines to enable selected ones of said memory cells.

18. The system of claim 17 wherein said rising edge state machine generates one of a regularly-increasing odd memory sequence and a regularly decreasing odd memory sequence, and wherein said falling edge state machine generates one of a regularly-increasing even memory sequence and a regularly decreasing even memory sequence.

19. The system of claim 6 wherein said decoder receives a unique memory address from an address source to initiate said data transfer operation.

20. The system of claim 19 wherein said data transfer operation is a write operation, and wherein said input/output circuit receives said information from a data source and responsively buffers said information using a local buffer system.

21. The system of claim 19 wherein said decoder determines whether said memory clock is currently synchronized with one of said first clock edge and said second clock edge.

22. The system of claim 21 wherein said decoder determines that said memory clock is currently synchronized with said first clock edge during a read operation, said precharge mechanism responsively beginning to precharge said memory cells from said odd horizontal rows.

23. The system of claim 21 wherein said decoder determines that said memory clock is currently synchronized with said first clock edge, said decoder responsively determining whether said memory address is an even memory address, said memory device aborting said data transfer operation when said memory address is not an even memory address, said decoder activating a corresponding even word line when said memory address is an even memory address.

24. The system of claim 23 wherein said data transfer operation is a read operation, said input/output circuit selecting even read bit lines coupled to said even horizontal rows using corresponding multiplexors.

25. The system of claim 23 wherein said input/output circuit accesses said memory cells from a selected one of said even horizontal rows to transfer said information for said data transfer operation.

26. The system of claim 21 wherein said decoder determines that said memory clock is currently synchronized with said second clock edge during a read operation, said precharge mechanism responsively beginning to precharge said memory cells from said even horizontal rows.

27. The system of claim 21 wherein said decoder determines that said memory clock is currently synchronized with said second clock edge, said decoder responsively determining whether said memory address is an odd memory address, said memory device aborting said data transfer operation when said memory address is not an odd memory address, said decoder activating a corresponding odd word line when said memory address is an odd memory address.

28. The system of claim 27 wherein said data transfer operation is a read operation, said input/output circuit selecting odd read bit lines coupled to said odd horizontal rows using corresponding multiplexors.

29. The system of claim 27 wherein said input/output circuit accesses said memory cells from a selected one of said odd horizontal rows to transfer said information for said data transfer operation.

30. The system of claim 1 wherein said memory device repeatedly and alternately accesses said first cell group on said first edge of said memory clock to transfer said information, said memory device also repeatedly and alternately accessing said second cell group on said second edge of said memory clock to transfer said information.

31. A method for implementing a memory device to perform a data transfer operation, comprising the steps of:
configuring memory cells from said memory device into a first cell group and a second cell group for storing information;

accessing said first cell group on a first edge of a memory clock to transfer said information with a control device; and accessing said second cell group on a second edge of said memory clock to transfer said information with said control device.

32. The method of claim 31 wherein said first cell group includes even horizontal rows of said memory cells from said memory device, and wherein said second cell group includes odd horizontal rows of said memory cells from said memory device.

33. The method of claim 32 wherein said memory clock includes a periodic clock pulse, said first edge of said memory clock being a falling edge of said periodic clock pulse, said s econd edge of said memory clock being a rising edge of said periodic clock pulse.

34. The method of claim 32 wherein said memory clock includes a periodic clock pulse, said first edge of said memory clock being a rising edge of said periodic clock pulse, said second edge of said memory clock being a falling edge of said periodic clock pulse.

35. The method of claim 31 wherein said memory device is implemented as a local synchronous dynamic random-access memory in an integrated circuit device.

36. The method of claim 32 wherein said memory device comprises a decoder device, an input/output circuit, and a memory core that includes a matrix of said memory cells.

37. The method of claim 36 wherein said memory cells in said memory core are arranged in said even horizontal rows and said odd horizontal rows that occur in an alternating sequence in said memory core, said even horizontal rows each being enabled by separate even word lines from said decoder, said odd horizontal rows each being enabled by separate odd word lines from said decoder, said even horizontal rows each being accessed by separate even bit lines from said input/output circuit to transfer said information, said odd horizontal rows each being accessed by separate odd bit lines from said decoder to transfer said information.

38. The method of claim 37 wherein said memory cells are each coupled to said decoder through read word lines to enable a read operation and write word lines to enable a write operation, said memory cells being each coupled to said input/output circuit through read bit lines for transferring read data and write bit lines for transferring write data, said write bit lines also being inverted and supplied to each of said memory cells to provide a complement value for said write data.

39. The method of claim 38 wherein said each of said memory cells is implemented as a low-footprint memory cell to minimize a required cell size on a host integrated circuit, said low-footprint memory cell being implemented using two NMOS devices and two inverters in a write portion, said low-footprint memory cell being implemented using two NMOS devices in a read portion of said low-footprint memory cell.

40. The method of claim 37 wherein each of said even bit lines and said odd bit lines to said memory cells is also connected to a precharge mechanism that performs a precharge procedure for each of said memory cells to ensure that an accurate value for said information is read from said memory cells, said precharge mechanism including a PMOS device that is driven by said memory clock for said memory cells in said even horizontal rows, said PMOS device being driven by an inverted memory clock for said memory cells in said odd horizontal rows.

41. The method of claim 40 wherein said memory device alternately and repeatedly performs a first precharge/transfer procedure on said first edge of said memory and a second precharge/transfer procedure on said second edge of said memory clock, said first precharge/transfer procedure including simultaneously performing said precharge procedure on said odd horizontal rows of said memory cells and performing an even data transfer using a selected one of said even horizontal rows of said memory cells, said second precharge/transfer procedure including simultaneously performing said precharge procedure on said even horizontal rows of said memory cells and performing an odd data transfer using a selected one of said odd horizontal rows of said memory cells.

42. The method of claim 41 wherein said memory device utilizes an inverted memory clock for performing one of said first precharge/transfer procedure and said second precharge/transfer procedure.

43. The method of claim 36 wherein said input/output circuit includes a multiplexor that selects between an even read bit line and an odd read bit line to output said information during a read operation, said input/output circuit also including a buffer system to buffer said information during a write operation.

44. The method of claim 43 wherein said multiplexor includes a first transmission gate that is coupled to said even read bit line, said first transmission gate being controlled by said memory clock and an inverted memory clock that are coupled to opposing terminals of said first transmission gate, said multiplexor also including a second transmission gate that is coupled to said odd read bit line, said second transmission gate being controlled by said inverted memory clock and said memory clock that are coupled to opposing terminals of said second transmission gate, said multiplexor thereby providing a selected read output signal to a data destination through a driver circuit.

45. The method of claim 36 wherein said decoder includes a rising/falling edge flipflop, a predecoder, and an odd/even decoder structure, said predecoder receiving a synchronized memory address from said rising/falling edge flipflop, and responsively generating individual predecoded word lines that are buffered by said odd/even decoder structure before being transmitted to enable selected ones of said memory cells.

46. The method of claim 45 wherein said rising/falling edge flipflop is implemented as a master portion of a D flipflop that receives a memory address from an address source and responsively synchronizes said memory address to an appropriate one of said first edge and said second edge of said memory clock to generate said synchronized memory address, said rising/falling edge flipflop synchronizing an even memory address to said first edge of said memory clock, said rising/falling edge flipflop synchronizing an odd memory address to said second edge of said memory clock.

47. The method of claim 36 wherein said decoder includes a rising edge state machine and a falling edge state machine that each receive a starting address from an address source, said rising edge state machine generating an odd memory address sequence for an odd starting address, said falling edge state machine generating an even memory address sequence for an even starting address, said rising edge state machine providing said odd memory address sequence to an odd predecoder, said falling edge state machine providing said even memory address sequence to an even predecoder, said odd predecoder and said even predecoder responsively providing a predecoded memory address to an odd/even decoder structure that buffers and transmits corresponding word lines to enable selected ones of said memory cells.

48. The method of claim 47 wherein said rising edge state machine generates one of a regularly-increasing odd memory sequence and a regularly decreasing odd memory sequence, and wherein said falling edge state machine generates one of a regularly-increasing even memory sequence and a regularly decreasing even memory sequence.

49. The method of claim 36 wherein said decoder receives a unique memory address from an address source to initiate said data transfer operation.

50. The method of claim 49 wherein said data transfer operation is a write operation, and wherein said input/output circuit receives said information from a data source and responsively buffers said information using a local buffer system.

51. The method of claim 49 wherein said decoder determines whether said memory clock is currently synchronized with one of said first clock edge and said second clock edge.

52. The method of claim 51 wherein said decoder determines that said memory clock is currently synchronized with said first clock edge during a read operation, said precharge mechanism responsively beginning to precharge said memory cells from said odd horizontal rows.

53. The method of claim 51 wherein said decoder determines that said memory clock is currently synchronized with said first clock edge, said decoder responsively determining whether said memory address is an even memory address, said memory device aborting said data transfer operation when said memory address is not an even memory address, said decoder activating a corresponding even word line when said memory address is an even memory address.

54. The method of claim 53 wherein said data transfer operation is a read operation, said input/output circuit selecting even read bit lines coupled to said even horizontal rows using corresponding multiplexors.

55. The method of claim 53 wherein said input/output circuit accesses said memory cells from a selected one of said even horizontal rows to transfer said information for said data transfer operation.

56. The method of claim 51 wherein said decoder determines that said memory clock is currently synchronized with said second clock edge during a read operation, said precharge mechanism responsively beginning to precharge said memory cells from said even horizontal rows.

57. The method of claim 51 wherein said decoder determines that said memory clock is currently synchronized with said second clock edge, said decoder responsively determining whether said memory address is an odd memory address, said memory device aborting said data transfer operation when said memory address is not an odd memory address, said decoder activating a corresponding odd word line when said memory address is an odd memory address.

58. The method of claim 57 wherein said data transfer operation is a read operation, said input/output circuit selecting odd read bit lines coupled to said odd horizontal rows using corresponding multiplexors.

59. The method of claim 57 wherein said input/output circuit accesses said memory cells from a selected one of said odd horizontal rows to transfer said information for said data transfer operation.

60. The method of claim 31 wherein said memory device repeatedly and alternately accesses said first cell group on said first edge of said memory clock to transfer said information, said memory device also repeatedly and alternately accessing said second cell group on said second edge of said memory clock to transfer said information.

61. The method of claim 31 wherein said memory cells are divided into vertical rows that consume a reduced current draw from said memory device during a precharge/discharge cycle for a given transfer data throughput within a specified time period, because only either said memory cells from said first memory group or said memory cells from said second memory group are active for said data transfer operation.

62. A system for implementing a memory device to perform a data transfer operation, comprising:
    means for configuring memory cells from said memory device into a first cell group and a second cell group for storing information;
    means for accessing said first cell group on a first edge of a memory clock to transfer said information; and
    means for accessing said second cell group on a second edge of said memory clock to transfer said information.

* * * * *